(12) United States Patent
Holland et al.

(10) Patent No.: US 9,698,238 B2
(45) Date of Patent: Jul. 4, 2017

(54) METHOD OF FORMING ULTRA-THIN NANOWIRES

(71) Applicant: Taiwan Semiconductor Manufacturing Company, Ltd., Hsin-Chu (TW)

(72) Inventors: Martin Christopher Holland, Bertem (DE); Blandine Duriez, Brussels (DE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/865,354

(22) Filed: Sep. 25, 2015

(65) Prior Publication Data

US 2017/0092739 A1    Mar. 30, 2017

(51) Int. Cl.
| | | |
|---|---|---|
| *B82Y 30/00* | (2011.01) | |
| *B82Y 40/00* | (2011.01) | |
| *H01L 21/00* | (2006.01) | |
| *H01L 29/00* | (2006.01) | |
| *H01L 29/66* | (2006.01) | |
| *H01L 21/02* | (2006.01) | |
| *H01L 29/423* | (2006.01) | |
| *H01L 21/306* | (2006.01) | |
| *H01L 29/06* | (2006.01) | |

(52) U.S. Cl.
CPC .... *H01L 29/66522* (2013.01); *H01L 21/0262* (2013.01); *H01L 21/02543* (2013.01); *H01L 21/02546* (2013.01); *H01L 21/02603* (2013.01); *H01L 21/30621* (2013.01); *H01L 29/0676* (2013.01); *H01L 29/42392* (2013.01); *H01L 29/66666* (2013.01); *H01L 29/66742* (2013.01)

(58) Field of Classification Search
CPC ... B82Y 30/00; B82Y 40/00; H01L 21/02543; H01L 21/02603; H01L 21/0262; H01L 21/30621; H01L 29/66522; H01L 29/0676; H01L 29/42392; H01L 29/66742
See application file for complete search history.

(56) References Cited

U.S. PATENT DOCUMENTS

2012/0235117 A1*   9/2012  Fukui ................ H01L 21/02488
                                                                257/13

FOREIGN PATENT DOCUMENTS

TW           201246599           11/2012

OTHER PUBLICATIONS

Office Action issued on Oct. 21, 2016 in Taiwan Patent Application No. 104139094.

\* cited by examiner

*Primary Examiner* — Seahvosh Nikmanesh
(74) *Attorney, Agent, or Firm* — Haynes and Boone, LLP (57) ABSTRACT

Provided is a method of forming a nanowire-based device. The method includes forming a mask layer over a substrate; forming an opening in the mask layer; growing an arsenic-based nanowire from the substrate that extends through the opening; removing the mask layer; forming a phosphorus-based layer over the arsenic-based nanowire; and removing the phosphorus-based layer.

20 Claims, 14 Drawing Sheets

METHOD OF FORMING ULTRA-THIN NANOWIRES

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, functional density (i.e., the number of interconnected devices per chip area) has generally increased while geometry size (i.e., the smallest component (or line) that can be created using a fabrication process) has decreased. Despite advances in materials and fabrication, in order to further decrease the geometry size, conventional planar MOSFET devices have encounter challenging(s). As such, a variety of devices that are not planarity-based or include non-planar components have attracted attention such as, for example, a Fin FET device, a vertical FET, etc.

While a variety of techniques to fabricate a non-planar device (e.g., a vertical FET) have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 1:
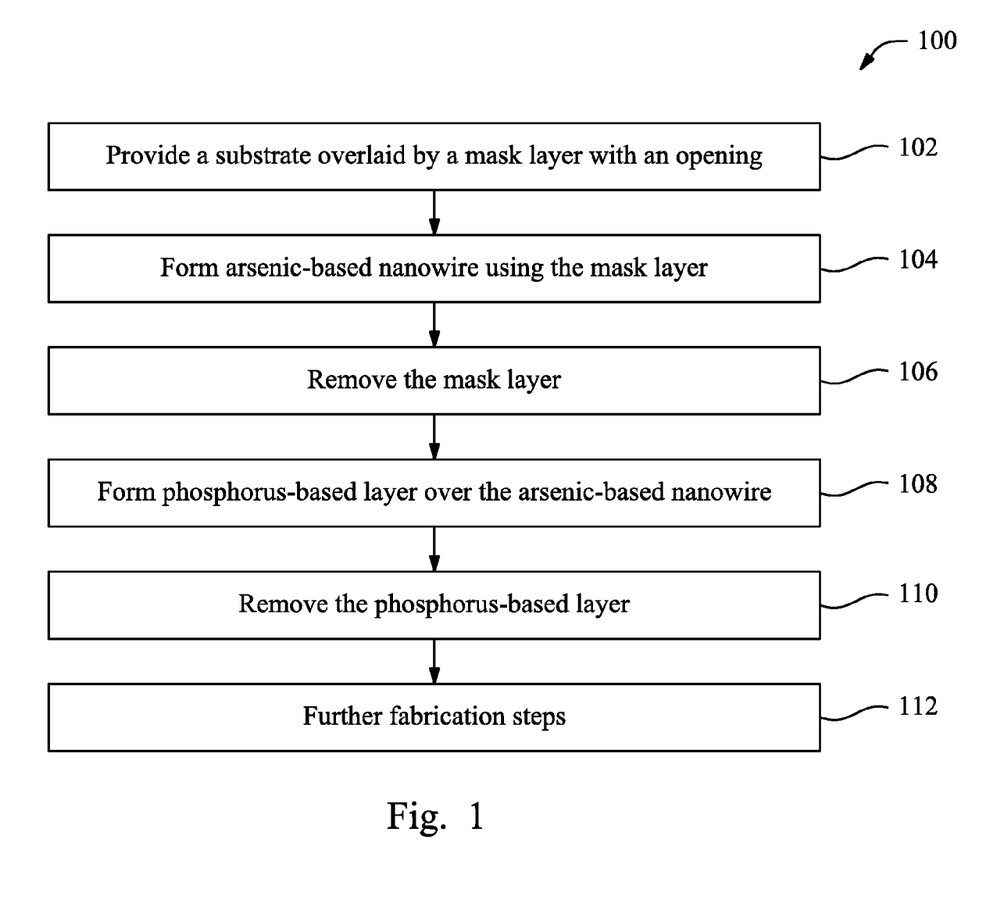
FIG. 1 depicts a method of fabricating a nanowire-based device in accordance with various embodiments.

FIG. 1 is a flowchart of a method 100 of fabricating a nanowire-based device 200 constructed according to various aspects of the present disclosure in one or more embodiments. The method 100 is described with reference to FIG. 1 and in conjunction with FIGS. 2A, 2B, 2C, 2D, 2E, 2F, and 2G. FIGS. 2A-2G are cross sectional views of forming the nanowire-based device 200 by the method 100 according to some embodiments. In some embodiments, the nanowire-based device 200 fabricated according to the disclosed method 100 may be an element of a field-effect-transistor (FET). For example, the nanowire-based device may form a channel, a source feature, and/or a drain feature of a vertical FET. It is understood that additional steps can be provided before, during, and/or after the method 100, and some of the steps described can be replaced, eliminated, and/or moved around for additional embodiments of the method 100.

As discussed above, method 100 discloses forming a nanowire-based device 200 with an ultrathin diameter. Generally, ultrathin diameter refers to diameter not greater than about 10 nanometers. Ultrathin nanowires are important because a nanowire-based device with such ultrathin nanowires may result in better performance of the device as a whole such as, for example, higher switching speed, lower leakage current, lower contact resistance, etc. This is especially true in non-planar devices.

Figure 2A:
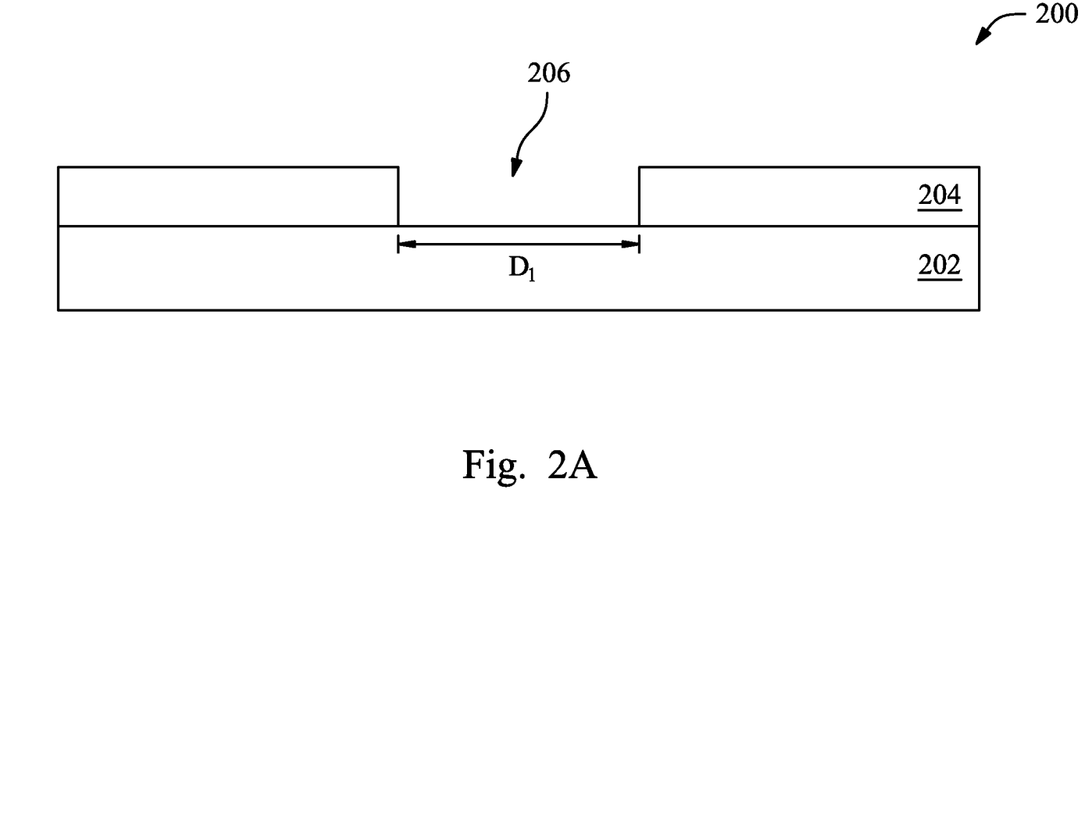
FIGS. 2A, 2B, 2C, 2D, 2E, 2F, 2G, 2H, and 2I depict cross-sectional views of a nanowire-based device fabricated by the method of FIG. 1 in accordance with various embodiments.

Referring to FIGS. 1 and 2A, method 100 begins at operation 102 by providing a substrate 202 overlaid by a mask layer 204 with an opening 206. In an embodiment, the substrate 202 is a semiconductor substrate and includes silicon. Alternatively, the substrate includes germanium, silicon germanium and/or other semiconductor materials such as III/V materials (e.g., InAs, GaAs, InP, GaN, etc.). In another embodiment, the substrate 202 may include a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Regarding the mask layer 204, in accordance with some embodiments, the mask layer 204 may be formed of a dielectric layer such as, for example, silicon nitride ($SiN_x$) and/or silicon oxide ($SiO_x$). The mask layer 204 may be formed by using any of a variety of deposition processes such as, for example, a physical vapour deposition (PVD) process, a chemical vapour deposition (CVD) process, and/or an atomic layer deposition (ALD) process. In the current embodiment, the opening 206 extending through mask layer 204 may be formed by using one of a variety of approaches that are suitable to form an opening with a well-controlled size (e.g., diameter) and position through the mask layer. For example, the opening 206 may be formed by using an electron beam lithography (EBL), a nanoimprint lithography, an optical lithography and a reactive ion etching (RIE) and/or a wet chemical etching method.

Figure 2B:
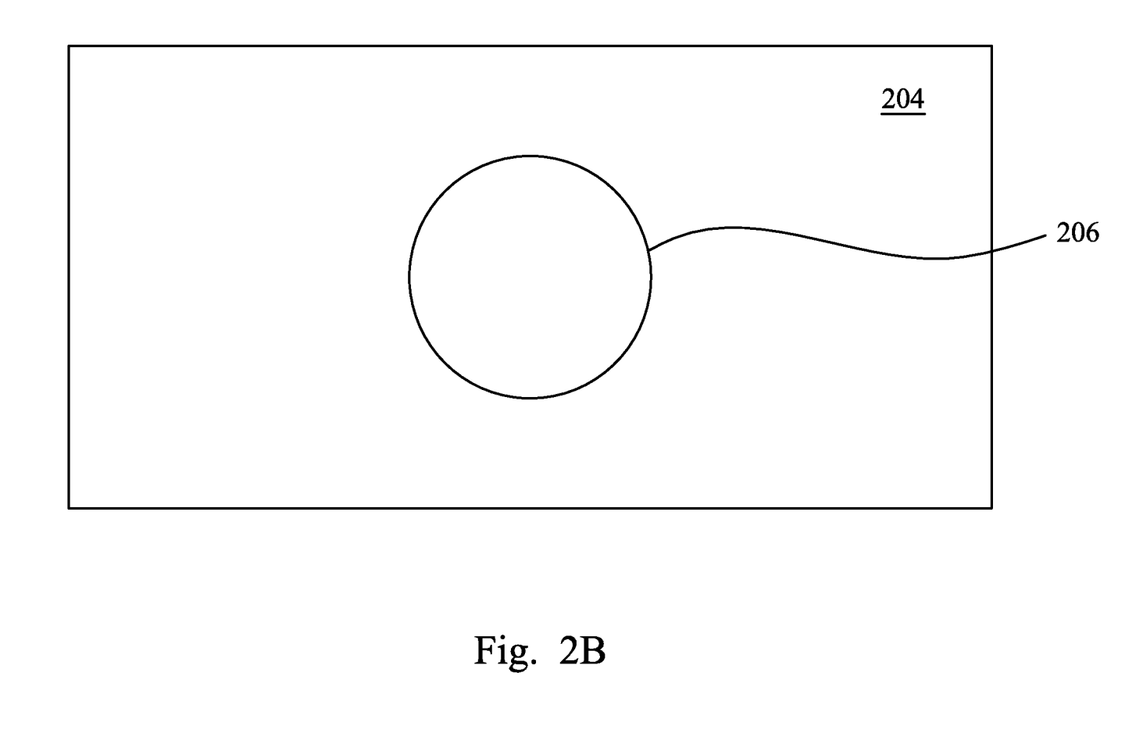

According to the current embodiment, the opening 206, from a top view, has a curvilinear shape (e.g., a circle) as shown in FIG. 2B. As such, the opening 206 may have a diameter $D_1$. In some embodiments, the diameter $D_1$ may range between about 15 nanometers to about 100 nanometers. While the opening 206 is described as a circle in the current embodiment, the opening 206 may have any of a variety of shapes, which may vary according to the approach of forming the opening 206.

Figure 2C:
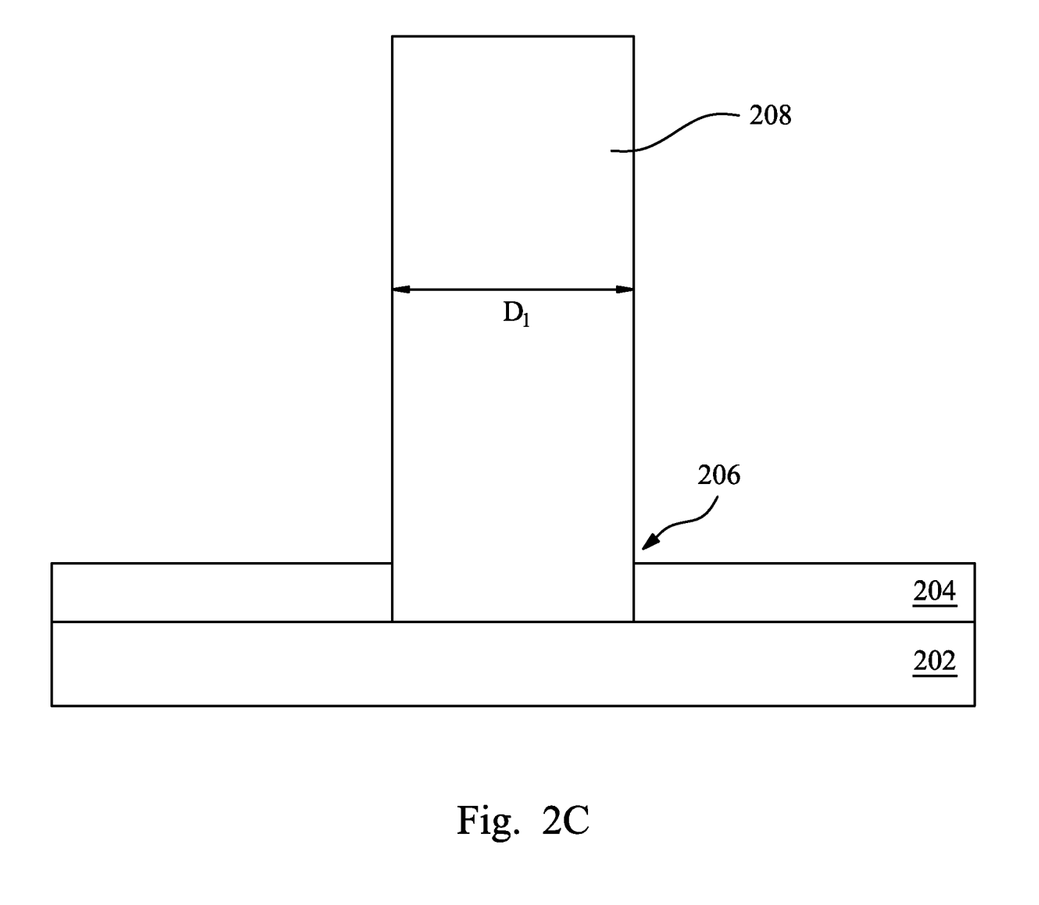

Referring to FIGS. 1 and 2C, method 100 proceeds to operation 104 with forming an arsenic-based nanowire 208 from the substrate 202 that extends through the opening 206 in mask later 204. According to some embodiments, the arsenic-based nanowire 208 may be formed of a material that is the same or different than the material of the substrate 202. In an example, the arsenic-based nanowire 208 may be formed of arsenic-based/V compound semiconductor materials (e.g., indium arsenide (InAs), gallium arsenide (GaAs), indium gallium arsenide (InGaAs), etc.) while the material of the substrate is formed of silicon. In a specific embodiment, the forming the arsenic-based nanowire 208 through the opening 206 may include using a selective area growth metal organic chemical vapour deposition (SAG-MOCVD) process or metal organic vapour phase epitaxy (SAG-MOVPE) deposition process. In other embodiments, forming arsenic-based nanowire 208 may include any of a variety of deposition approaches (e.g., CVD, MOCVD) may be used and remain within the scope of the present disclosure. In the example of using the SAG-MOCVD process to grow the arsenic-based nanowire 208, the operation 104 may include flowing arsenic-based precursor (e.g., arsine ($AsH_3$)) into an MOCVD chamber. In an embodiment, since the arsenic-based nanowire 208 is formed within opening 206 in the mask layer 204, the arsenic-based nanowire 208 includes a curvilinear cross-section (i.e. circular shape) and such a curvilinear nanowire 208 may include a diameter that is approximately the same as diameter $D_1$.

Figure 2D:
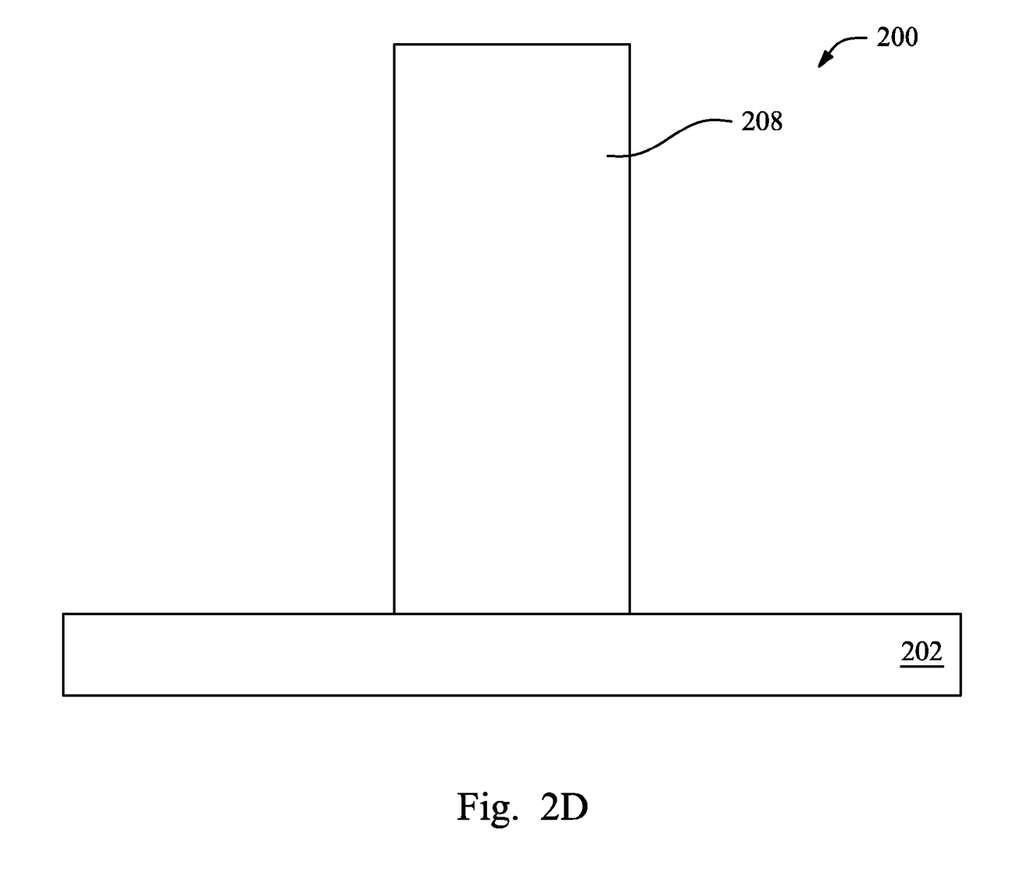

Referring now to FIGS. 1 and 2D, method 100 continues to operation 106 with removing the mask layer 204. The removing the mask layer 204 may include a wet and/or a dry etching process. In some specific embodiments, and continuing with the same example in which the arsenic-based nanowire 208 is formed in an MOCVD chamber, the removing the mask layer 204 may be performed in the same MOCVD chamber by using a chemical dry etching process such as, for example, using tetrafluoromethane/oxygen ($CF_4$/O2) plasma etching process.

Figure 2E:
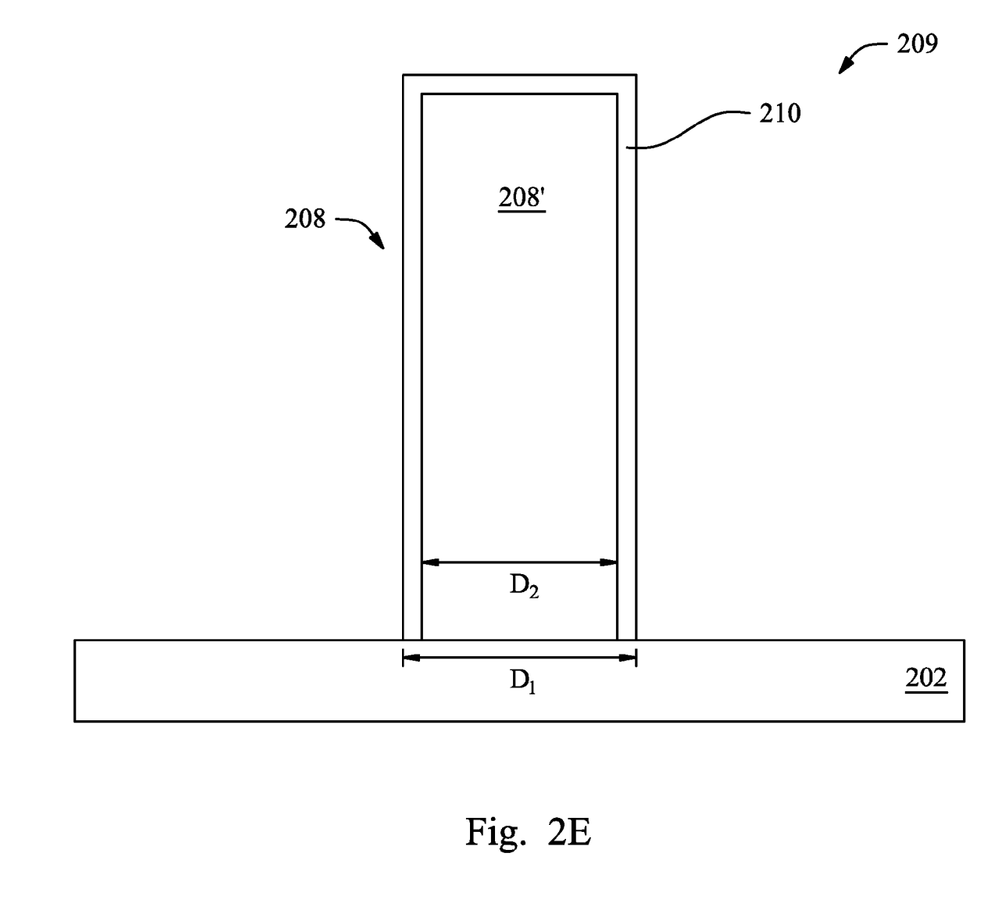

Referring now to FIGS. 1 and 2E, method 100 continues to operation 108 with forming a phosphorus-based layer 210 over nanowire 208. In the illustrated embodiment of FIG. 2E, the phosphorus-based layer 210 is within the nanowire 208. That is, after the forming of the phosphorus-based layer 210, the nanowire 208 is formed of nanowire 208' covered by the phosphorus-based layer 210. As such, the nanowire 208' may have a diameter $D_2$ that is less than the diameter of the nanowire 208, $D_1$. Continuing with the same example of forming the nanowire 208 and removing the mask layer 204 in the MOCVD chamber, the operation 108 with forming the phosphorus-based layer 210 may include flowing a phosphorus-based precursor (i.e., operation 209 with respect to FIG. 2E) into the same MOCVD chamber. Any of a variety of phosphorus-based precursors may be used in the operation 108 such as, for example, tertiarybutylphosphine (TBP), phosphine ($PH_3$), etc. Such a forming of the phosphorus layer 210 over the surface of the nanowire 208' is based on an arsenic-phosphorous (As-P) exchange mechanism, which will be described in detail below.

In an embodiment in which the nanowire 208 is formed of InAs (formed in operation 104 of method 100), while flowing the phosphorus-based precursor (i.e., operation 209 with respect to FIG. 2E) into the MOCVD chamber, phosphorus atoms that are dissolved from the phosphorus-based precursor interact with indium atoms on the surface of the InAs nanowire 208. As such, indium atoms on the surface of the InAs nanowire 208 (i.e., in the form of InAs) react with the dissolved phosphorus atoms thereby forming an InP layer (i.e., the phosphorus-based layer 210) and the formed InP layer 210 covers surface of the InAs nanowire 208'. In other words, only the indium atoms of the surface of the InAs nanowire 208 reacts with the dissolved phosphorus atoms and transforms to the form of InP while an inner portion of the InAs nanowire 208 (e.g., nanowire 208') remains in the form of InAs. In order not to evaporate the InAs nanowire 208 in this specific example, temperature of the MOCVD chamber is maintained to not exceed about 550° C. while flowing the phosphorus-based precursor (i.e., operation 209 with respect to FIG. 2E) into the MOCVD chamber. In a specific embodiment, the formed InP layer 210 may be a monolayer, which means that a monolayer of the surface of the original nanowire 208 has been transformed from the form of InAs to the form of InP.

Figure 2F:
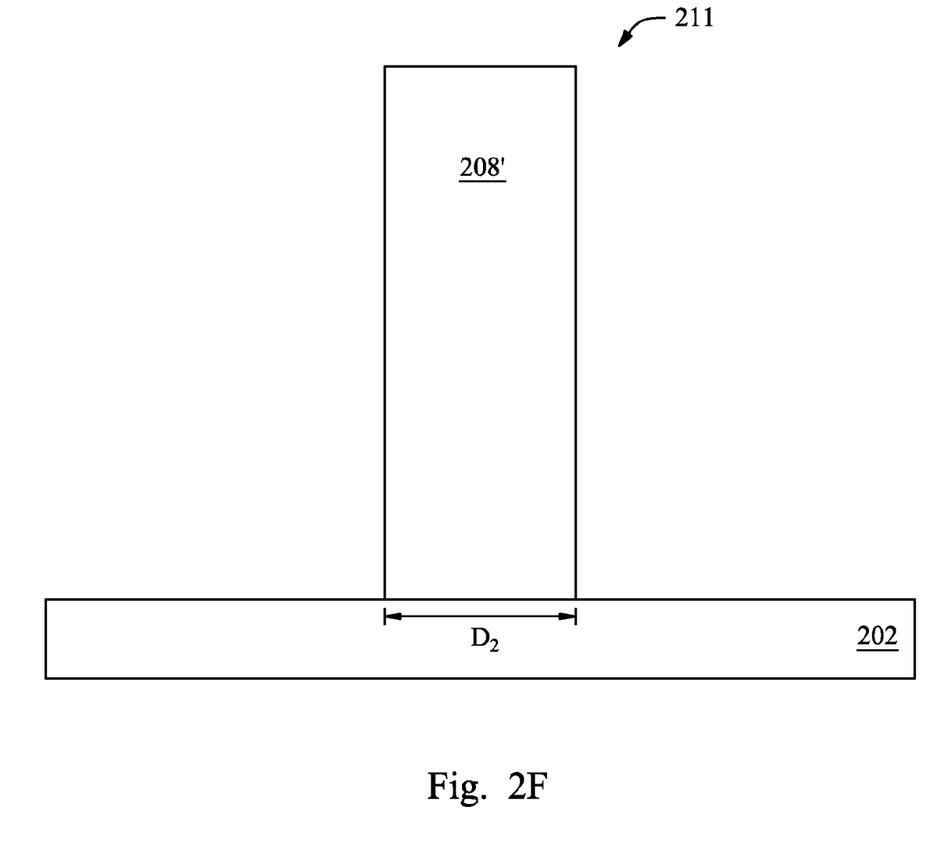

Referring now to FIGS. 1 and 2F, method 100 continues to operation 110 with removing the phosphorus-based layer 210 from the nanowire 208'. As illustrated in FIG. 2F, after the phosphorus-based layer 210 is removed (i.e., operation 211), surfaces of the nanowire 208' are exposed and thus the exposed nanowire 208' has the diameter $D_2$ as described above. Using the example given above (InAs nanowire 208' and InP layer 210), the removing of phosphorus-based layer 210 may include an operation 211 that includes flowing gaseous hydrogen chloride (HCl) into the MOCVD chamber. Since the formed phosphorus-based layer 210 is within the originally formed nanowire 208, the diameter of the nanowire 208' ($D_2$) may be not greater than the diameter of the originally formed nanowire 208 ($D_1$), that is, $D_2<D_1$. More particularly, in the embodiment of the InAs nanowire 208, the monolayer InP layer 210, and the InAs nanowire 208' provided above, the diameter of the nanowire 208' ($D_2$) may equal the diameter of the originally formed nanowire 208 ($D_1$) being subtracted by twice thickness of the InP monolayer, that is, $D_2=D_1-2\times$thickness of the InP monolayer. In some embodiments, the diameter $D_2$ may range between about 5 nanometers to about 10 nanometers (i.e., less than 10 nanometers).

In some embodiments, operations 108 and 110 of method 100 may be iteratively performed. In particular, after performing operations 108 and 110 (i.e. a first iteration), method 100 may iterate to operation 108 and continue to operation 110 until a desired diameter $D_2$ is reached. After each iteration, a thinner nanowire (smaller diameter) may be reached.

Figure 2G:
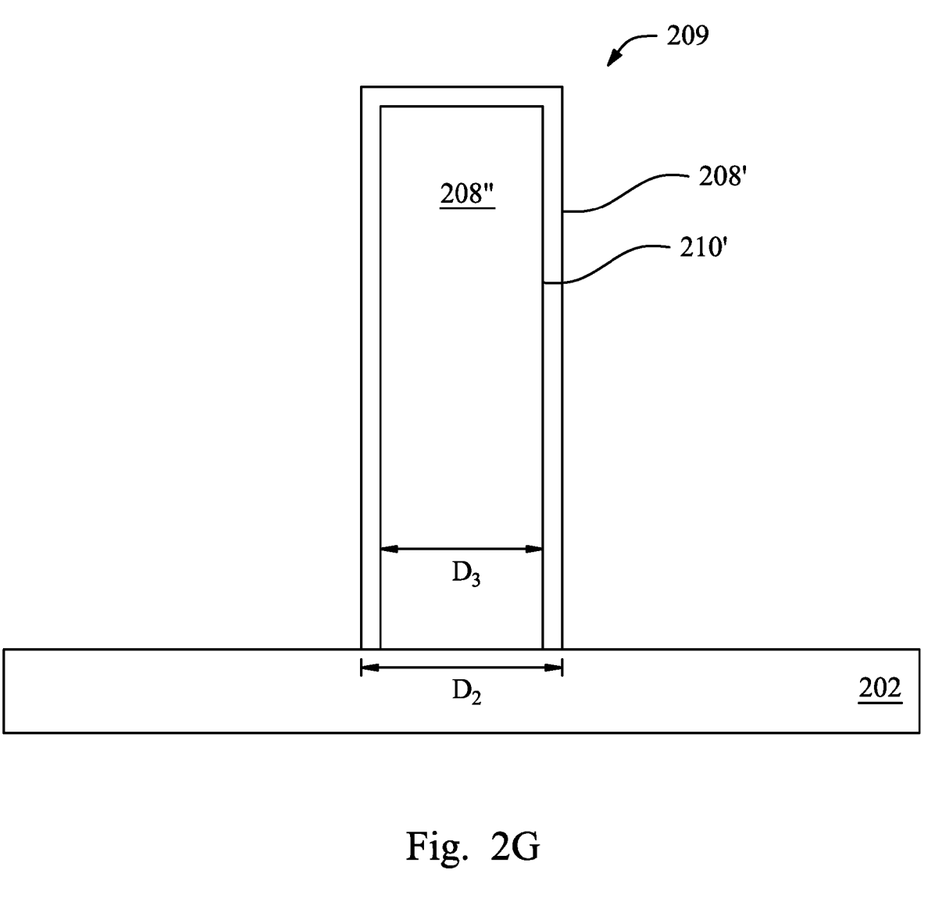
Figure 2H:
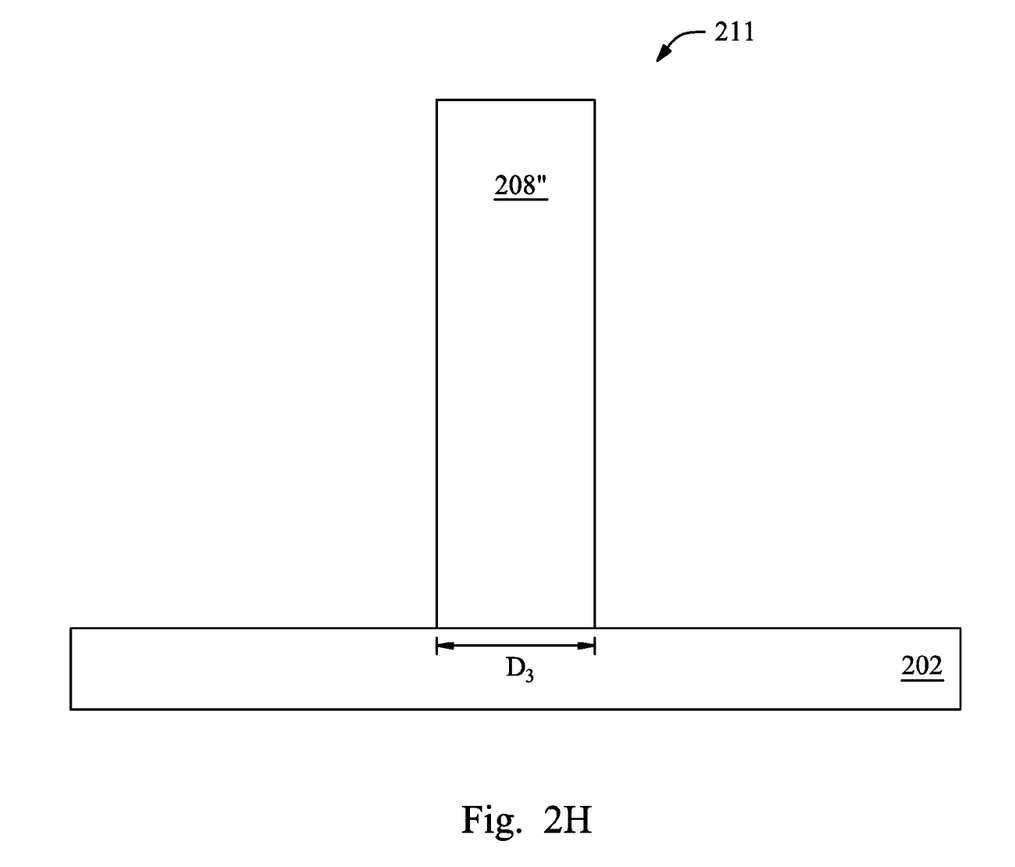

In the illustrated embodiment of FIGS. 2G and 2H, a second iteration of 209 with forming a phosphorus-based layer 210' in the nanowire 208' (with respect to operation 108) and subsequent 211 with removing the formed phosphorus-based layer 210' (with respect to operation 110) is respectively illustrated. In the illustrated embodiment of FIG. 2G and using the same example given above, the InP layer 210' is formed by the indium atoms on the surface of the InAs nanowire 208' interacting with dissolved phosphorus atoms and an inner portion of the InAs nanowire 208' retains as InAs nanowire 208". By flowing gaseous hydrogen chloride into the MOCVD chamber (operation 211 with respect to FIG. 2H), the formed InP layer 210' is removed such that the retained InAs nanowire 208" is exposed. Such InAs nanowire 208" may have a diameter $D_3$, which is less than $D_2$. In some embodiments, the diameter $D_3$ may range between about 5 nanometers to about 10 nanometers (i.e., less than 10 nanometers).

Figure 2I:
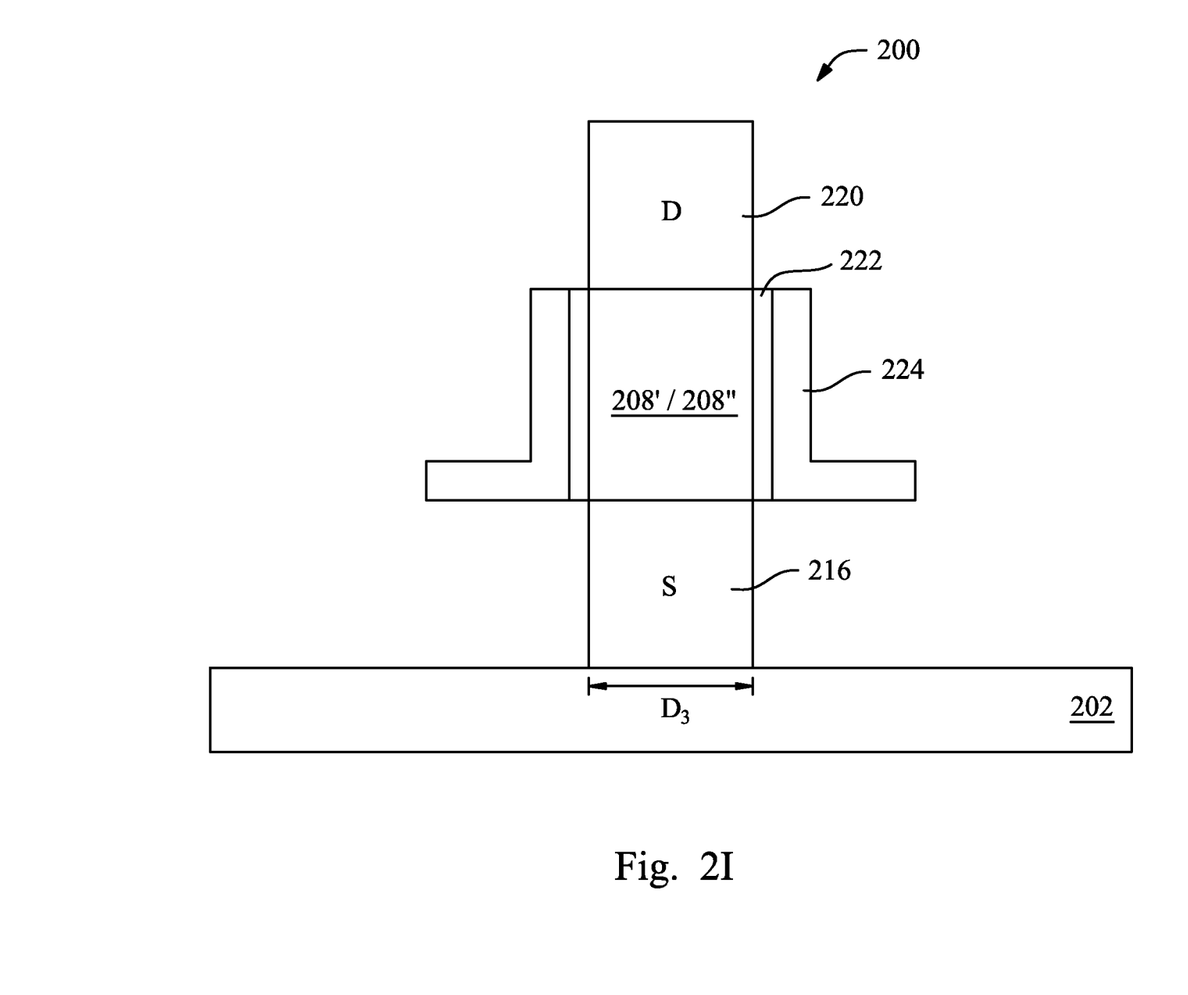

Referring to FIGS. 1 and 2I, method 100 may then proceed to block 112 that includes further fabrication steps. In an example in which the device 200 is implemented as a vertical FET, a source feature 216, a channel region 218, and a drain feature 220 may be formed in the nanowire 208'/208''. Accordingly, gate dielectric layer 222 and gate contact 224 may be formed to wrap the channel region 218. Such fabrication steps may result in the device 200 to be formed as an element of a vertical FET. In some embodiments, the block 112 may include one or more fabrication steps so as to form the above-identified features (e.g., source feature 216, channel region 218, drain feature 220, gate dielectric layer 222, and gate contact 224, etc.), including but not limited to, a patterning process, an implantation process, an epitaxial growth process, and/or a combination thereof. The example in the illustrated embodiment of FIG. 2I is merely shown as an example. Any of a variety of features/elements may be included (but not shown in FIG. 2I) in the device 200 such as, for example, contact features for the source/drain features, an inter-layer dielectric layer lies between different feature, an interconnection layer, etc.

Figure 3:
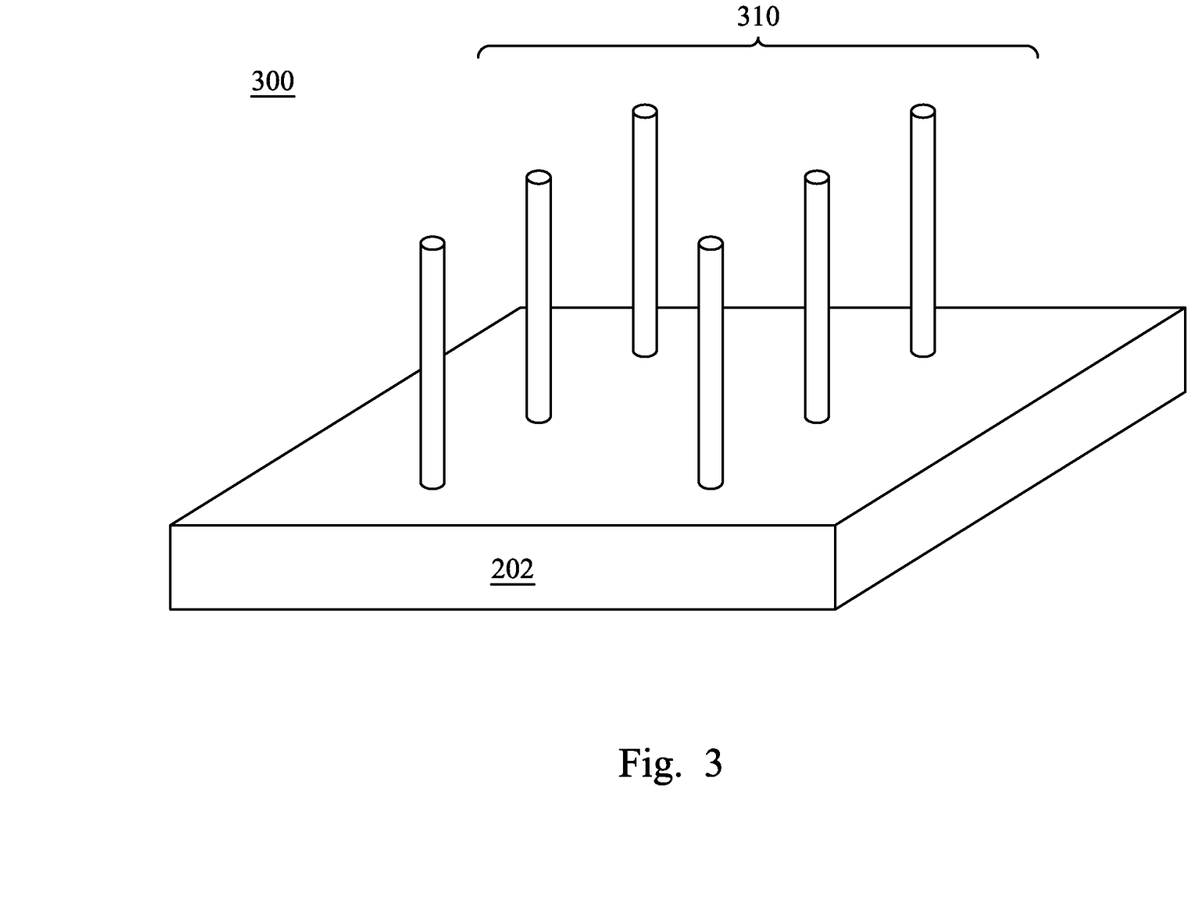
FIG. 3 depicts an example of an array of nanowires fabricated by the method of FIG. 1 in accordance with various embodiments.

Additionally, referring now to FIG. 3, a nanowire-based device 300 that includes a plurality of nanowires 310 formed on the substrate 202 is illustrated. In an embodiment, such a plurality of nanowires 310 may form an array of nanowires. Such a nanowire-based device 300 may be formed using the embodiment of the method 100.

Figure 4A:
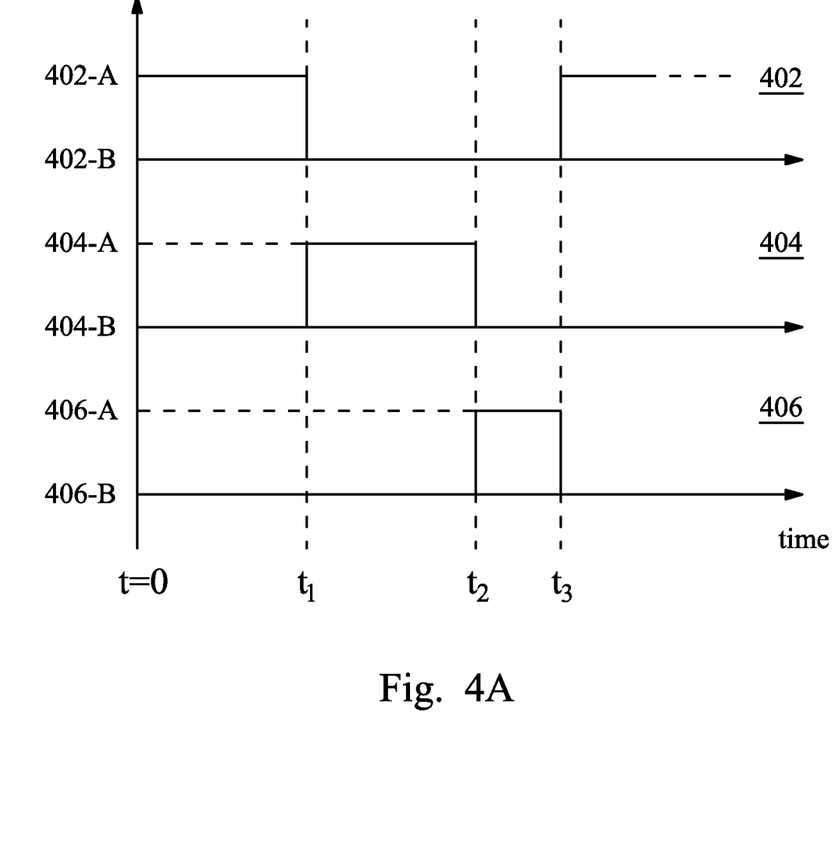
FIGS. 4A, 4B, and 4C illustrate examples of sequences to form the arsenic-based nanowire, the phosphorus-based layer, and to remove the phosphorus-based layer with respect to the method of FIG. 1.
Figure 4B:
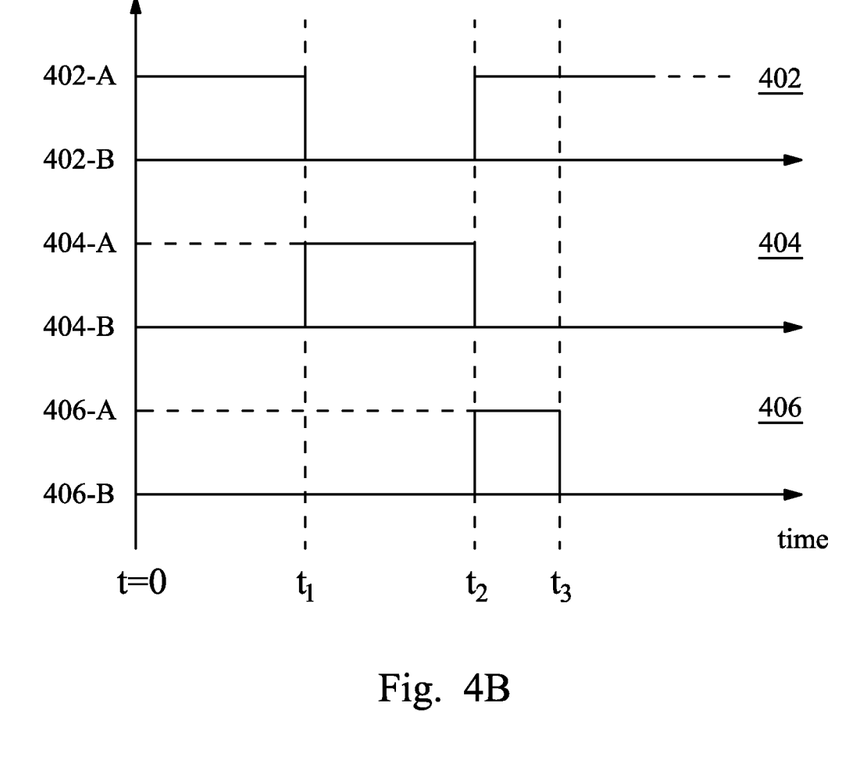
Figure 4C:
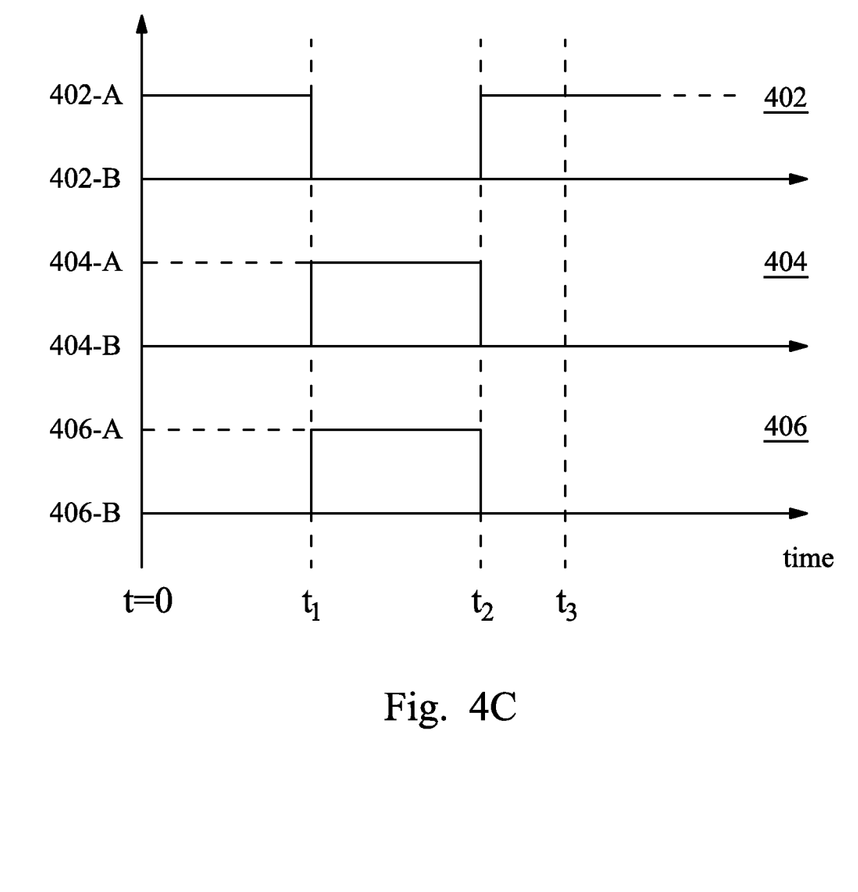

Referring now to FIGS. 4A, 4B, and 4C, some embodiments of sequences of forming the arsenic-based nanowire (as described with respect to operation 104 in FIG. 1), the forming the phosphorus-based layer (as described with respect to operation 108 in FIG. 1), and the removing the formed phosphorus-based layer (as described with respect to operation 110 in FIG. 1) are illustrated. In FIGS. 4A-4C, signal 402 represents a logic waveform of flowing arsenic-based precursor into an MOCVD chamber over time; signal 404 represents a logic waveform of flowing phosphorus-based precursor into the MOCVD chamber over time; signal 406 represents a logic waveform of flowing gaseous hydrogen chloride into the MOCVD chamber over time. More specifically, each logic waveform has two values (high and low) over time. For example, the logic waveform of signal 402 includes a high value 402-A and a low value 402-B, where the high value 402-A represents flowing the arsenic-based precursor into the MOCVD chamber and the low value 402-B represents ceasing flowing the arsenic-based precursor into the MOCVD chamber. Similarly, the logic waveform of signal 404 includes a high value 404-A and a low value 404-B, where the high value 404-A represents flowing the phosphorus-based precursor into the MOCVD chamber and the low value 404-B represents ceasing flowing the phosphorus-based precursor into the MOCVD chamber. The logic waveform of signal 406 includes a high value 406-A and a low value 406-B, where the high value 406-A represents flowing the gaseous hydrogen chloride into the MOCVD chamber and the low value 406-B represents ceasing flowing the gaseous hydrogen chloride into the MOCVD chamber.

Based on the embodiment of FIG. 4A, the flowing of the arsenic-based precursor may extend from the beginning (t=0) to t1; then starting from t1, the flowing of the arsenic-based precursor is ceased and the flowing of the phosphorus-based precursor starts and may extend from t1 to t2; then starting from t2, the flowing of the arsenic-based precursor remains ceased, the flowing of the phosphorus-based precursor is ceased, and the flowing of the gaseous hydrogen chloride starts and may extend from t2 to t3; after t3, the flowing of the gaseous hydrogen chloride is ceased and the flowing of the arsenic-based precursor returns. As such, during t=0 to t1, the arsenic-based nanowire 208 is grown (i.e., operation 104 of method 100); during t1 to t2, the phosphorus-based layer 210 is formed (i.e., operation 106 of method 100); during t2 to t3, the formed phosphorus-based layer 210 is removed and the nanowire 208'/208'' with smaller diameter retains (i.e., operation 110 of method 100); after t3, the returned arsenic-based precursor may be used for one of a variety of purposes such as, for example, passivating surfaces of the retained nanowire (e.g., 208' and 208'').

Based on the embodiment of FIG. 4B, the flowing of the arsenic-based precursor may extend from the beginning (t=0) to t1; then starting from t1, the flowing of the arsenic-based precursor is ceased and the flowing the phosphorus-based precursor starts and may extend from t1 to t2; then starting from t2, the flowing of the arsenic-based precursor returns, the flowing of the phosphorus-based precursor is ceased, and the flowing of the gaseous hydrogen chloride starts and may extend from t2 to t3; after t3, the flowing of the gaseous hydrogen chloride is ceased and the flowing of the arsenic-based precursor remains. As such, during t=0 to t1, the arsenic-based nanowire 208 is grown (i.e., operation 104 of method 100); during t1 to t2, the phosphorus-based layer 210 is formed (i.e., operation 106 of method 100); during t2 to t3, the formed phosphorus-based layer 210 is removed and the nanowire 208'/208'' with smaller diameter retains (i.e., operation 110 of method 100) while the retuned arsenic-based precursor may be used to prevent thermal evaporation of the nanowire 208'/208''; after t3, the returned arsenic-based precursor may be used for one of a variety of purposes such as, for example, passivating surfaces of the retained nanowire (e.g., 208' and 208'').

Based on the embodiment of FIG. 4C, the flowing of the arsenic-based precursor may extend from the beginning (t=0) to t1; then starting from t1, the flowing of the arsenic-based precursor is ceased and the flowing of the phosphorus-based precursor and the gaseous hydrogen chloride start and may extend from t1 to t2; then starting from t2, the flowing of the arsenic-based precursor returns and the flowing of the phosphorus-based precursor and the gaseous hydrogen chloride are ceased and may extend from t2 to t3; after t3, the flowing of the arsenic-based precursor remains. As such, during t=0 to t1, the arsenic-based nanowire 208 is grown (i.e., operation 104 of method 100); during t1 to t2, while the phosphorus-based layer 210 is formed (i.e., operation 106 of method 100), the phosphorus-based layer 210 is etched/removed subsequently and/or simultaneously to form the retained nanowire 208'/208''; during t2 to t3 and after t3, the returned arsenic-based precursor may be used for one of a variety of purposes such as, for example, passivating surfaces of the retained nanowire (e.g., 208' and 208'').

The present disclosure provides embodiments to form an arsenic-based nanowire with ultrathin diameter (diameter<10 nanometers) by (iteratively) forming/etching phosphorus-based layer over surfaces of the arsenic-based nanowire. Such embodiments provide a variety of advantages over conventional approach to form an arsenic-based nanowire with a thin diameter. In an example, by sequentially controlling flowings of precursor gases/etching gas into a same chamber, growings of an arsenic-based nanowire, an overlaid phosphorus-based layer, and subsequent etching of the overlaid phosphorus-based layer may be performed sequentially/simultaneously in the same chamber. Thereafter, any of a variety of undesirable contamination during the growth process and/or the etching process may be advantageously avoided. In another example, in a conventional approach, in order to reach such a thin diameter (<10 nanometers) arsenic-based nanowire, a wet etching process is one of various approaches to etch surfaces of a formed nanowire. However, such a wet etching process may generally cause damages (e.g., mechanical distortion, surface damage, etc.) on the nanowire. In contrast, the embodiments of the present disclosure transforms surfaces of a grown arsenic-based nanowire into a phosphorus-based layer and subsequently flowing etching gas to selectively etch the phosphorus-based layer. In this manner, mechanical distortion on the nanowire which generally occurs by using a wet etching process may be advantageously avoided. Yet in another example, since the forming/etching of a phosphorus-based layer over surfaces of an arsenic-based nanowire may be performed iteratively, the arsenic-based nanowire with even thinner diameter (e.g., less than 5 nanometers) may be formed by using the disclosed embodiments.

Various embodiments of a method of fabricating a nanowire-based device are disclosed. In an embodiment, the method includes forming a mask layer over a substrate; forming an opening in the mask layer; growing an arsenic-based nanowire from the substrate that extends through the opening; removing the mask layer; forming a phosphorus-based layer over the arsenic-based nanowire; and removing the phosphorus-based layer.

In another embodiment, the method includes forming a mask layer over a substrate; forming an opening in the mask layer; growing a first arsenic-based nanowire from the substrate and through the opening by applying an arsenic-based gas, wherein the first arsenic-based nanowire has a first diameter; removing the mask layer; and forming a phosphorus-based monolayer over the first arsenic-based nanowire by applying a phosphorus-based gas; and removing the phosphorus-based monolayer by applying a hydrogen chloride thereby forming a second arsenic-based nanowire with a second diameter, wherein the second diameter is different than the first diameter.

Yet in another embodiment, the method includes forming a mask layer over a substrate in a chamber; forming an opening in the mask layer; growing an arsenic-based nanowire through the opening by flowing arsenic-based gas into the chamber; removing the mask layer; forming a phosphorus-based layer over the arsenic-based nanowire by flowing phosphorus-based gas into the chamber; and removing the phosphorus-based layer by flowing gaseous hydrogen chloride into the chamber.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a mask layer over a substrate;
   forming an opening in the mask layer;
   growing an arsenic-based nanowire from the substrate that extends through the opening;
   removing the mask layer;
   forming a phosphorus-based layer over the arsenic-based nanowire; and
   removing the phosphorus-based layer, wherein removing the phosphorus-based layer includes applying hydrogen chloride gas to the phosphorous-based layer.

2. The method of claim 1, wherein forming the phosphorus-based layer includes applying tertiarybutylphosphine (TBP) or phosphine ($PH_3$) to the arsenic-based nanowire at a temperature that is not greater than about 500° C.

3. The method of claim 1, wherein the arsenic-based nanowire is formed of at least one of indium arsenide (InAs), gallium arsenide (GaAs), and indium gallium arsenide (InGaAs).

4. The method of claim 1, wherein the phosphorus-based layer is formed of at least one of indium phosphide (InP), gallium phosphide (GaP), and indium gallium phosphide (InGaP).

5. The method of claim 1, wherein the phosphorus-based layer is a monolayer.

6. The method of claim 1, further comprising forming a gate structure around the arsenic-based nanowire.

7. The method of claim 6, wherein forming the gate structure over the arsenic-based nanowire includes:
   forming a gate dielectric around the nanowire; and
   forming a gate electrode around the gate dielectric layer.

8. A method comprising:
   forming a mask layer over a substrate;
   forming an opening in the mask layer;
   growing a first arsenic-based nanowire from the substrate and through the opening by applying an arsenic-based gas, wherein the first arsenic-based nanowire has a first diameter;
   removing the mask layer; and
   forming a phosphorus-based monolayer over the first arsenic-based nanowire by applying a phosphorus-based gas; and
   removing the phosphorus-based monolayer by applying a hydrogen chloride thereby forming a second arsenic-based nanowire with a second diameter, wherein the second diameter is different than the first diameter.

9. The method of claim 8, wherein forming the phosphorus-based monolayer includes applying tertiarybutylphosphine (TBP) and/or phosphine ($PH_3$) at a temperature not greater than about 500° C.

10. The method of claim 8, wherein the arsenic-based nanowire is formed of at least one of indium arsenide (InAs), gallium arsenide (GaAs), and indium gallium arsenide (InGaAs).

11. The method of claim 8, wherein the phosphorus-based monolayer is formed of at least one of indium phosphide (InP), gallium phosphide (GaP), and indium gallium phosphide (InGaP).

12. The method of claim 8, wherein removing the phosphorus-based monolayer by applying hydrogen chloride includes ceasing the applying of the arsenic-based gas and ceasing the applying of the phosphorus-based gas.

13. The method of claim 8, wherein removing the phosphorus-based monolayer by applying the hydrogen chloride includes continuing the applying of the arsenic-based gas and ceasing the applying of the phosphorus-based gas into the chamber.

14. The method of claim 8, wherein the removing the phosphorus-based monolayer by applying the hydrogen chloride includes ceasing the applying of the arsenic-based and continuing the applying of the phosphorus-based gas into the chamber.

15. A method comprising:
  forming a mask layer over a substrate in a chamber;
  forming an opening in the mask layer;
  growing an arsenic-based nanowire through the opening by flowing arsenic-based gas into the chamber;
  removing the mask layer;
  forming a phosphorus-based layer over the arsenic-based nanowire by flowing phosphorus-based gas into the chamber; and
  removing the phosphorus-based layer by flowing gaseous hydrogen chloride into the chamber.

16. The method of claim 15, wherein forming the phosphorus-based layer over the arsenic-based nanowire includes flowing at least one of tertiarybutylphosphine (TBP) and phosphine ($PH_3$) into the chamber at a temperature not greater than about 500° C.

17. The method of claim 15, wherein removing the phosphorus-based layer by flowing the gaseous hydrogen chloride into the chamber includes ceasing the flowing of the arsenic-based gas into the chamber and ceasing the flowing of the phosphorus-based gas into the chamber.

18. The method of claim 15, wherein removing the phosphorus-based layer by flowing the gaseous hydrogen chloride into the chamber includes continuing the flowing of the arsenic-based gas into the chamber and ceasing the flowing of the phosphorus-based gas into the chamber.

19. The method of claim 15, wherein removing the phosphorus-based layer by flowing the gaseous hydrogen chloride into the chamber includes ceasing the flowing of the arsenic-based gas into the chamber and continuing the flowing of the phosphorus-based gas into the chamber.

20. The method of claim 1, wherein removing the mask layer occurs prior to forming the phosphorus-based layer over the arsenic-based nanowire.

* * * * *